United States Patent
Park et al.

(10) Patent No.: US 9,341,946 B2
(45) Date of Patent: May 17, 2016

(54) PHOTOSENSITIVE RESIN COMPOSITION, PATTERN FORMED USING SAME AND DISPLAY PANEL COMPRISING SAME

(71) Applicant: LG CHEM, LTD., Seoul (KR)

(72) Inventors: Kwang Han Park, Daejeon (KR); Sunghyun Kim, Daejeon (KR); Dongchang Choi, Daejeon (KR); Kyung Soo Choi, Daejeon (KR); Sang Chul Lee, Daejeon (KR); Heeyoung Oh, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/403,968

(22) PCT Filed: May 24, 2013

(86) PCT No.: PCT/KR2013/004572
§ 371 (c)(1),
(2) Date: Nov. 25, 2014

(87) PCT Pub. No.: WO2013/176517
PCT Pub. Date: Nov. 28, 2013

(65) Prior Publication Data
US 2015/0125789 A1    May 7, 2015

(30) Foreign Application Priority Data

May 25, 2012   (KR) .................. 10-2012-0056398

(51) Int. Cl.
*G03F 7/038* (2006.01)
*G03F 7/033* (2006.01)
(Continued)

(52) U.S. Cl.
CPC .............. *G03F 7/0388* (2013.01); *G03F 7/033* (2013.01); *G03F 7/038* (2013.01); *G03F 7/0385* (2013.01); *G03F 7/0751* (2013.01); *G03F 7/30* (2013.01); *G06F 2203/04103* (2013.01)

(58) Field of Classification Search
CPC .......... G03F 7/032; G03F 7/033; G03F 7/038; G03F 7/0388; G03F 7/0755; G03F 7/091; G06F 2203/04103
USPC .......... 430/7, 322, 605, 913, 325, 329, 270.1, 430/281.1; 349/12; 345/173
See application file for complete search history.

(56) References Cited

U.S. PATENT DOCUMENTS 6,399,277 B1    6/2002   Nojima et al.
6,577,802 B1 *  6/2003   Chien ................. C03C 25/1065
                                                    385/128
(Continued)

FOREIGN PATENT DOCUMENTS

JP          10-20493 A       1/1998
JP       2008-009401 A       1/2008
(Continued)

OTHER PUBLICATIONS

Office Action issued in Korean Patent Application No. 10-2013-0059108 on Apr. 28, 2015 along with English translation.
(Continued)

*Primary Examiner* — Amanda C Walke
(74) *Attorney, Agent, or Firm* — Rothwell, Figg, Ernst & Manbeck, P.C.

(57) ABSTRACT

The present specification provides a photosensitive resin composition comprising an alkali-soluble binder, a crosslinkable compound, a photopolymerization initiator, a solvent, a coloring agent and an epoxy adhesion promoter. The photosensitive resin composition has excellent insulating properties and light-shielding properties and shows excellent chemical resistance in an etching process and a stripping process. Thus, the photosensitive resin composition can be formed into a thin bezel layer having a gradual taper, and thus can provide an integrated touch sensor that makes it possible to prevent short circuits from occurring in metal wiring and minimize any decrease in resistance resulting from high-temperature processing.

25 Claims, 1 Drawing Sheet

(51) Int. Cl.
*G03F 7/075* (2006.01)
*G03F 7/30* (2006.01)

(56) References Cited

U.S. PATENT DOCUMENTS

| | | | | |
|---|---|---|---|---|
| 8,211,598 B2* | 7/2012 | Einaga | ................... | G03F 7/0007 430/288.1 |
| 2004/0048197 A1* | 3/2004 | Sabnis | ................... | G03F 7/0751 430/286.1 |
| 2010/0085518 A1* | 4/2010 | Choi | ...................... | G03F 7/032 349/110 |
| 2010/0104981 A1* | 4/2010 | Choi | ..................... | G03F 7/0007 430/286.1 |
| 2010/0285408 A1* | 11/2010 | Miyasaka | ................. | C08F 2/50 430/286.1 |
| 2011/0151379 A1* | 6/2011 | Choi | ..................... | G03F 7/0007 430/270.1 |
| 2012/0091407 A1* | 4/2012 | Lee | ......................... | G03F 7/032 252/582 |
| 2013/0344437 A1 | 12/2013 | Yang et al. | | |
| 2014/0145973 A1* | 5/2014 | Jeon | ........................ | G06F 3/041 345/173 |

FOREIGN PATENT DOCUMENTS

| | | |
|---|---|---|
| JP | 2008-233244 A | 10/2008 |
| JP | 2010-055066 A | 3/2010 |
| JP | 2011-048195 A | 3/2011 |
| JP | 2011-209443 A | 10/2011 |
| KR | 10-2005-0061224 A | 6/2005 |
| KR | 10-2009-0071694 A | 7/2009 |
| KR | 10-2011-0068861 A | 6/2011 |
| KR | 10-2011-0071965 A | 6/2011 |
| KR | 10-2011-0076489 A | 7/2011 |
| KR | 10-2012-0033895 A | 4/2012 |
| TW | 201042384 A | 12/2010 |
| TW | 201120571 A1 | 6/2011 |
| TW | 201214043 A1 | 4/2012 |
| TW | 201215630 A | 4/2012 |
| WO | WO 2009/048231 A2 * | 4/2009 ............. C08G 61/12 |
| WO | 2012/044070 A2 | 4/2012 |
| WO | 2013-051805 A2 | 4/2013 |

OTHER PUBLICATIONS

Written Opinion issued in International Application No. PCT/KR2013/004572 issued Aug. 26, 2013 along with English translation, 17 pages.
Office Action issued in Korean Patent Application No. 10-2013-0059108 on Mar. 30, 2014 along with English translation, 24 pages.
Office Action issued in Korean Patent Application No. 10-2013-0059108 on Oct. 24, 2014 along with English translation, 16 pages.
Office Action issued in Taiwanese Patent Application No. 102118434 on Oct. 17, 2014 along with English translation, 13 pages.
Office Action issued in Korean Patent Application No. 10-2013-0059108 on Oct. 24, 2014 along with English translation, 17 pages.
Taiwanese Office Action, Application No. 102118434, mailed Mar. 6, 2015 and its Summary in English, 7 pages.
Office Action issued in Japanese Patent Application No. 2015-513946 on Sep. 1, 2015 along with English translation, 18 pages.

* cited by examiner (a)
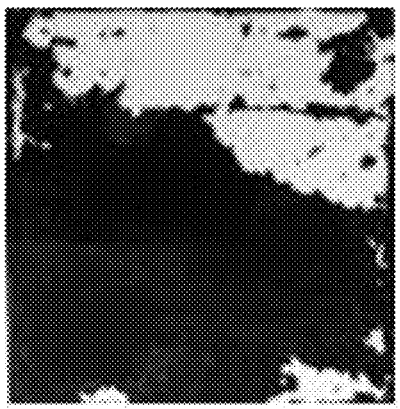
(b)
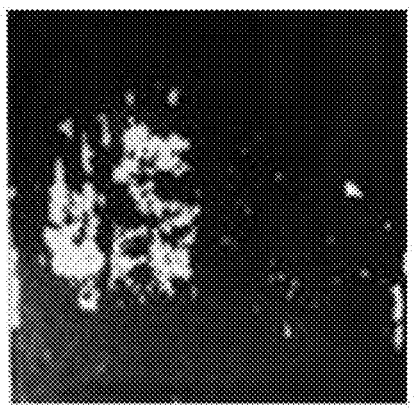
(c)
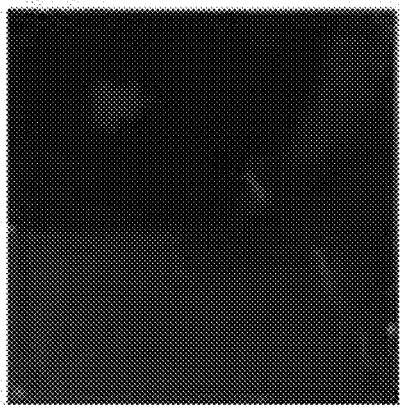
(d)
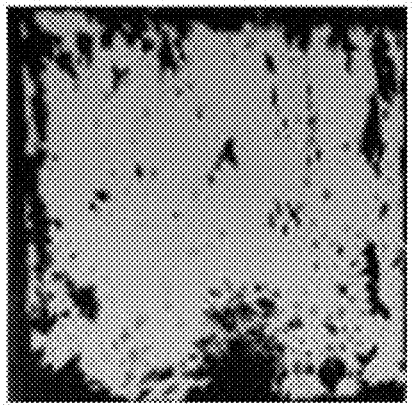
(e)
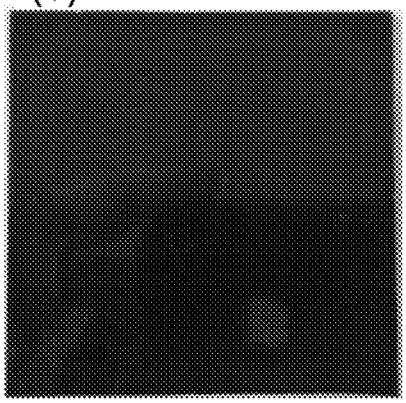

PHOTOSENSITIVE RESIN COMPOSITION, PATTERN FORMED USING SAME AND DISPLAY PANEL COMPRISING SAME

CROSS REFERENCE TO RELATED APPLICATIONS

This application is a 35 U.S.C. §371 National Phase Entry Application from PCT/KR2013/004572, filed May 24, 2013, and designating the United States, which claims priority under 35 U.S.C. §119 to Korean Patent Application No. 10-2012-0056398 filed May 25, 2012, which is incorporated herein by reference in its entirety.

TECHNICAL FIELD

The present specification relates to a photosensitive resin composition, a pattern formed using the same, and a display panel comprising the pattern. This application claims the benefit of the filing date of Korean Patent Application No. 10-2012-0056398, filed with the Korean Intellectual Property Office on May 25, 2012, the disclosure of which is incorporated herein in its entirety by reference.

BACKGROUND ART

In recent years, touch screens have taken a significant share of the mobile display market. The touch screen is operated by touching the screen directly with the human hand or with an object that is used for input, without using input devices such as a keyboard or a mouse. Accordingly, most operations on the screen, including internet access, moving images, and multiple touches, are easily performed, and thus the touch screen is one of the most convenient user interfaces.

Examples of methods for realizing the touch screen include a resistive overlay method, a capacitive overlay method, an ultrasonic method, an optical method, an infrared method, etc. The touch screen based on the resistive overlay method has problems in that it has low durability and light transmittance and in that multi-touch cannot be realized in practice.

One method for solving the problems associated with the resistive overlay method is the capacitive overlay method. The capacitive overlay method is a method in which the touch screen is operated by sensing micro-current generated by the human body. The touch screen based on the capacitive overlay method uses a constant current, and thus has excellent touch sensitivity, and particularly, enables the implementation of a multi-touch function. In addition, it has advantages in that, because it uses glass as a cover, it has good durability and a light transmittance of 90% or higher and gives an elegant feeling. However, it has shortcomings in that the input method is limited and the production cost is high.

In a conventional method for manufacturing an integrated touch screen panel, bezel layers are formed using ink by a screen printing method, and thus the thicknesses thereof are mostly 6 μm or more, and 10 μm on average.

However, when a sensor layer is applied to a bezel layer having this thickness, a short circuit occurs due to the difference in height between the bezel layer and the substrate, making it difficult to drive the sensor.

For this reason, there has been a need for a material that can substitute for conventional ink for forming bezels and is thin, is gradually tapered, and has sufficient light-shielding properties. Particularly, because the resistance of a touch sensor is reduced in a high-temperature process for forming it, there has been the requirement to solve the problem of deterioration of the properties of a touch screen panel, which is required to exhibit high resistance, attributable to the bezel material.

In addition, there has been a need to develop a bezel material having excellent chemical resistance in order to prevent a peeling phenomenon from occurring in an etching process and a stripping process, which are used to form metal wiring on a bezel layer.

PRIOR ART DOCUMENTS

Patent Documents

Patent document 1: Korean Patent Laid-Open Publication No. 10-2008-0107846.

DISCLOSURE

Technical Problem

It is an object of the present specification to provide a photosensitive resin composition capable of providing a pattern that is thin, gradually tapered, and exhibits sufficient light-shielding ability and excellent chemical resistance and/or heat resistance when forming a bezel pattern in a display panel.

Technical Solution

The present specification provides a photosensitive resin composition comprising an alkali-soluble binder, a crosslinkable compound, a photopolymerization initiator, a solvent, a colorant and an epoxy adhesion promoter.

The present specification also provides a pattern formed using the photosensitive resin composition.

The present specification also provides a method for fabricating a pattern, the method comprising the steps of: applying the above photosensitive resin composition to a substrate; and exposing and developing the applied photosensitive resin composition.

The present specification also provides a display panel comprising the above panel.

Advantageous Effects

A photosensitive resin composition according to an embodiment of the present specification has excellent insulating properties and light-shielding properties and shows excellent chemical resistance in an etching process and a stripping process. Thus, the photosensitive resin composition can be formed into a bezel pattern layer that is thin and gradually tapered, in a display panel, thus making it possible to prevent short circuits from occurring in metal wiring and minimizing the decrease in resistance in a high-temperature process.

DESCRIPTION OF DRAWINGS

FIG. 1 shows images of peeling from a metal. Specifically, FIG. 1(a) shows an image from step 4 of Comparative Example 2, FIG. 1(b) shows an image from step 5 of Example 1, FIG. 1(c) shows an image from step 6 of Example 2, FIG. 1(d) shows an image from step 2 of Comparative Example 12, and FIG. 1(e) shows an image from step 6 of Example 3.

MODE FOR INVENTION

Hereinafter, the present specification will be described in detail.

Unless defined otherwise, the technical and scientific terms used herein have the same meaning as commonly understood by one of ordinary skill in the art.

In order to lower the production cost, which is the problem with the capacitive overlay method, the present inventors have developed a method for fabricating an integrated touch screen panel, in which the number of indium tin oxide (ITO) sensor layers is reduced or in which a touch sensor is attached directly to strengthened glass which is the uppermost layer. In this case, effects of improving the transmissivity of the touch screen panel and reducing the production cost can be obtained. This integrated touch panel is fabricated by coating a shielding bezel layer on cover glass and forming a touch sensor layer thereon.

In addition, the present inventors have made extensive efforts to solve the above-described problems, and as a result, have developed a composition suitable for forming a pattern in a touch screen panel, thereby completing the present specification.

An embodiment of the present specification provides a photosensitive resin composition comprising an alkali-soluble binder, a crosslinkable compound, a photopolymerization initiator, a solvent, a colorant and an epoxy adhesion promoter.

The photosensitive resin composition of the present specification has increased chemical resistance in an etching process and a stripping process because it contains the epoxy adhesion promoter. Thus, it ensures adhesion to metal wiring by preventing the peeling phenomenon from occurring.

The present specification also provides a photosensitive resin composition comprising an alkali-soluble binder, a crosslinkable compound, a photopolymerization initiator, a solvent, a colorant, an epoxy adhesion promoter and an epoxy binder.

The photosensitive resin composition of the present specification contains the epoxy binder and the epoxy adhesion promoter, and thus has improved chemical resistance in an etching process and a stripping process compared to the composition containing the epoxy adhesion promoter without the epoxy binder. In addition, it has improved adhesion to metal wiring because the peeling phenomenon is prevented from occurring.

In an embodiment of the present specification, the epoxy binder is specifically selected from the group consisting of a bisphenol type epoxy resin, a novolac type epoxy resin, a glycidyl ester type epoxy resin, a glycidyl amine type epoxy resin, a linear aliphatic epoxy resin, an alicyclic epoxy resin, and a biphenyl type epoxy resin.

In an embodiment of the present specification, the epoxy binder has an epoxide equivalent weight of 5000 g/eq or less.

The epoxy binder may have an epoxide equivalent weight of 1 to 5000 g/eq.

The epoxy binder may have an epoxide equivalent weight of 200 to 400 g/eq.

When the epoxide equivalent weight is 200 g/eq or more, the stability of the composition is not problematic, and when the epoxide equivalent weight is 400 g/eq or less, the adhesion of the composition is not problematic.

As used herein, the term "epoxide equivalent weight" (EEW) refers to a molecular weight corresponding to one epoxide reactive group, which is a value obtained by dividing the weight-average molecular weight of epoxy resin by the number of reactive groups per molecule.

In the present specification, the weight-average molecular weight is a value measured using gel permeation chromatography (GPC).

In an embodiment of the present specification, the content of the epoxy binder is 10 to 50 parts by weight based on 100 parts by weight of the entire binder.

When the content of the epoxy binder is 10 parts by weight or more based on 100 parts by weight of the entire binder, the composition will have excellent adhesion to metal due to an increase in the chemical resistance, and when the content is 50 parts by weight or less, it is possible to prevent a decrease in the storage stability of the composition.

The content of the epoxy binder may be 15 to 30 parts by weight based on 100 parts by weight of the entire binder.

When the content of the epoxy binder is 15 parts by weight or more based on 100 parts by weight of the entire binder, the composition will have excellent adhesion to metal due to an increase in the chemical resistance compared to when the content of the epoxy binder is 10 parts by weight, and when the content of the epoxy binder is 30 parts by weight or less, it is possible to more effectively prevent any decrease in the storage stability of the composition compared to when the content is 50 parts by weight or less.

As used herein, the term "entire binder" refers to the combination of the alkali-soluble binder and the epoxy binder.

In an embodiment of the present specification, the content of the epoxy binder is 1 to 10 parts by weight based on 100 parts by weight of the photosensitive resin composition.

When the content of the epoxy binder is 1 part by weight or more based on 100 parts by weight of the photosensitive resin composition, the adhesion of the composition is not problematic, and when the content of the epoxy binder is 10 parts by weight or less based on 100 parts by weight of the photosensitive resin composition, the stability of the composition is not problematic, and thus the composition is not gelled.

In an embodiment of the present specification, the epoxy adhesion promoter is an acryloyl silane coupling agent or alkyl trimethoxysilane.

The acryloyl silane coupling agent may be one or more selected from the group consisting of methacryloyloxy propyltrimethoxysilane, methacryloyloxy propyldimethoxysilane, methacryloyloxy propyltriethoxysilane and methacryloyloxy propyldiethoxysilane.

The alkyl trimethoxysilane may be one or more selected from the group consisting of octyl trimethoxysilane, dodecyl trimethoxysilane and octadecyl trimethoxysilane.

In an embodiment of the present specification, the epoxy adhesion promoter is silsesquioxane.

As used herein, the term "adhesion promoter" refers to a material that increases the adhesion between a substrate and the photosensitive resin composition.

The adhesion promoter includes a compound having a silanol group. The silanol group serves to maintain the adhesion of the composition to the substrate, and an alkyl group and the like opposite the silanol group provide additional effects.

As used herein, the term "epoxy adhesion promoter" means that a silanol group-containing compound included in the adhesion promoter has an epoxy group opposite the silanol group.

The epoxy adhesion promoter serves to increase the extent of curing of a film compared to when using a general adhesion promoter, resulting in an increase in the chemical resistance of the film. This characteristic shows the effect of maintaining adhesion imparted by the silanol group after a chemical resistance test.

In an embodiment of the present specification, the content of the epoxy adhesion promoter is 0.01 to 1 part by weight based on 100 parts by weight of the photosensitive resin composition.

When the content of the epoxy adhesion promoter is 0.01 parts by weight or more, the effect of addition thereof will occur, and when the content of the epoxy adhesion promoter is 1 part by weight or less, the effect of addition thereof will further increase.

In an embodiment of the present invention, the alkali-soluble binder includes one or more of a cardo-based binder and an acrylic binder.

When the alkali-soluble binder that is used in the present specification is a mixture of the cardo-based binder and the acrylic binder, the cardo-based binder and the acrylic binder may be mixed at a ratio of 1 to 99:99 to 1.

The cardo-based binder and the acrylic binder may be mixed at a weight ratio of 50:50.

When the cardo-based binder or the acrylic binder is included in the photosensitive resin composition, it shows an excellent effect on adhesion to a substrate.

In the present specification, the cardo-based binder is a resin having a framework structure composed of two cyclic structures bonded to quaternary carbon atoms.

In an embodiment of the present specification, the cardo-based binder comprises a repeating unit represented by the following formula 1:

Formula 1

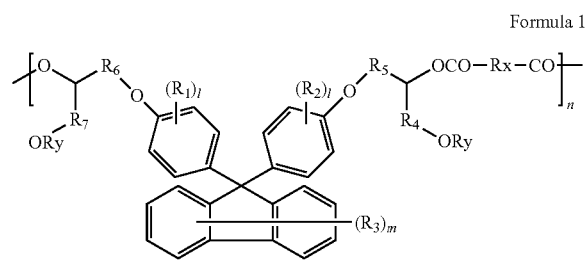

The substituents in formula 1 will now be described in further detail.

Rx in formula 1 may be a structure formed by the reaction of a five-membered cyclic carboxylic anhydride or a diisocyanate, but is not limited thereto.

Examples of the five-membered cyclic carbonic anhydride include, but are not limited to, succinic anhydride, methylsuccinic anhydride, 2,2-dimethylsuccinic anhydride, isobutenylsuccinic anhydride, 1,2-cyclohexanedicarbonic anhydride, hexahydro-4-methylphthalic anhydride, itaconic anhydride, tetrahydrophthalic anhydride, 5-norbornene-2,3-dicarbonic anhydride, methyl-5-norbornene-2,3-dicarbonic anhydride, 1,2,3,4-cyclobutanetetracarbonic dianhydride, maleic anhydride, citraconic anhydride, 2,3,-dimethylmaleic anhydride, 1-cyclopentene-1,2-dicarbonic dianhydride, 3,4,5,6-tetrahydrophthalic anhydride, phthalic anhydride, bisphthalic anhydride, 4-methylphthalic anhydride, 3,6-dichlorophthalic anhydride, 3-hydrophthalic anhydride, 1,2,4-benzenetricarbonic anhydride, 4-nitrophthalic anhydride, and diethyleneglycol-1,2-bistrimellitic anhydride.

Examples of the diisocyanate include, but are not limited to, trimethylene diisocyanate, tetramethylene diisocyanate, hexamethylene diisocyanate, pentamethylene diisocyanate, 1,2-propylene diisocyanate, 2,3-butylene diisocyanate, 1,3-butylene diisocyanate, dodecamethylene diisocyanate, 2,4,4-trimethyl hexamethylene diisocyanate, w,w'-diisocyanate-1,3-dimethylbenzene, w,w'-diisocyanate-1,4-dimethylbenzene, w,w'-diisocyanate-1,3-diethylbenzene, 1,4-tetramethylxylene diisocyanate, 1,3-tetramethylxylene diisocyanate, isophorone diisocyanate, 1,3-cyclopentane diisocyanate, 1,3-cyclohexane diisocyanate, 1,4-cyclohexane diisocyanate, methyl-2,4-cyclohexane diisocyanate, methyl-2,6-cyclohexane diisocyanate, 4,4'-methylene bisisocyanate methylcyclohexane, 2,5-isocyanatemethyl bicyclo[2,2,2]heptane, and 2,6-isocyanatemethyl bicyclo[2,2,1]heptane.

Ry in formula 1 may be selected from the group consisting of hydrogen, acryloyl and methacryloyl, but is not limited thereto.

$R_1$ to $R_3$ in formula 1 may be each independently selected from the group consisting of hydrogen, a halogen group, a substituted or unsubstituted $C_1$ to $C_5$ alkyl group, a substituted or unsubstituted $C_1$ to $C_5$ alkoxy group, and a substituted or unsubstituted $C_2$ to $C_5$ alkenyl group.

$R_4$ to $R_7$ in formula 1 may be each independently selected from the group consisting of a substituted or unsubstituted $C_1$ to $C_5$ alkylene group, a substituted or unsubstituted $C_1$ to $C_5$ alkoxylene group, and a substituted or unsubstituted $C_2$ to $C_5$ alkenylene group.

The halogen group may be fluorine, chlorine, bromine or iodine.

The alkyl group may be linear or branched, and substituted or unsubstituted, and the number of carbon atoms thereof is not specifically limited, but may be 1 to 5. Specific examples of the alkyl group include, but are not limited to, methyl, ethyl, propyl, isopropyl, butyl, t-butyl and the like.

The alkylene group may be linear or branched, and substituted or unsubstituted, and the number of carbon atoms thereof is not specifically limited, but may be 1 to 5. Specific examples of the alkylene group include, but are not limited to, methylene, ethylene, propylene, isopropylene, butylene, t-butylene and the like.

The alkoxy group may be linear or branched, and substituted or unsubstituted, and the number of carbon atoms thereof is not specifically limited, but may be 1 to 5. Specific examples of the alkoxy group include, but are not limited to, methoxy, ethoxy, isopropyloxy and the like.

The alkoxylene group may be linear or branched, and substituted or unsubstituted, and the number of carbon atoms thereof is not specifically limited, but may be 1-5. Specific examples of the alkoxylene group include, but are not limited to, methoxylene, ethoxylene, isopropyloxylene and the like.

The alkenyl group may be linear or branched, and substituted or unsubstituted, and the number of carbon atoms thereof is not specifically limited, but may be 1 to 5. Specific examples of the alkenyl group include, but are not limited to, ethenyl, propenyl, butenyl, pentenyl and the like.

The alkenylene group may be linear or branched, and substituted or unsubstituted, and the number of carbon atoms thereof is not specifically limited, but may be 1 to 5. Specific examples of the alkenylene group include, but are not limited to, ethenylene, propenylene, butenylene, pentenylene and the like.

Each of the substituents may be a halogen group, a substituted or unsubstituted $C_1$ to $C_5$ alkyl group, a substituted or unsubstituted $C_1$ to $C_5$ alkoxy group, and a substituted or unsubstituted $C_2$ to $C_5$ alkenyl group.

l in formula 1 is an integer ranging from 1 to 4, m is an integer ranging from 1 to 8, and n indicates the number of the repeating units represented by formula 1.

In an embodiment of the present invention, the cardo-based binder has an acid value of 10 to 200 KOH mg/g.

When the acid value of the cardo-based binder is 10 KOH mg/g or more, the composition will have good solubility in an alkali developing solution, whereby the developing time of the composition will be reduced and no residue will remain on a substrate, and when the acid value is 200 KOH mg/g or less, the desorption of the pattern can be prevented and the straightness of the pattern can be ensured.

The acid value of the cardo-based binder may be 30 to 150 KOH mg/g.

When the acid value of the cardo-based binder is 30 KOH mg/g or more, development will not fail, and when the acid value is 150 KOH mg/g or less, the development of the pattern without the loss of the pattern can be ensured.

In an embodiment of the present specification, the cardo-based binder has a weight-average molecular weight of 1,000 to 30,000.

When the weight-average molecular weight of the cardo-based binder is 1,000 or more, the binder will have a good binding function, and the pattern can resist physical external force, and thus is not lost, and can satisfy fundamental physical properties such as heat resistance and chemical resistance. When the weight-average molecular weight of the cardo-based binder is 30,000 or less, the composition will have good developability in an alkali developing solution, and it will have good flowability, whereby the coating thickness can be controlled and the uniformity of the coating thickness can be ensured.

The weight-average molecular weight of the cardo-based binder may be 1,500 to 10,000.

When the weight-average molecular weight of the cardo-based binder is 1,500 or higher, a film can be sufficiently formed, and when the weight-average molecular weight of the cardo-based binder is 10,000 or lower, a film can be sufficiently formed without the loss of the pattern, and chemical resistance can be ensured.

In an embodiment of the present specification, the acrylic binder is composed of a monomer that imparts mechanical strength to a film and a monomer that imparts alkali solubility.

The acrylic binder may serve to reduce the taper angle of the pattern.

As used herein, the phrase "taper angle of the pattern" refers to the angle between the base side and the adjacent side of the trapezoid of the pattern.

The acrylic binder may be composed of a monomer that imparts mechanical strength to a film and a monomer that imparts alkali solubility, and additionally may also serve to reduce the taper angle of the pattern.

The monomer that is used to control the mechanical strength and taper angle of the film may be one or more selected from the group consisting of unsaturated carboxylic esters such as benzyl(meth)acrylate, methyl(meth)acrylate, ethyl(meth)acrylate, butyl(meth)acrylate, dimethylaminoethyl(meth)acrylate, isobutyl(meth)acrylate, t-butyl(meth)acrylate, cyclohexyl(meth)acrylate, isobornyl(meth)acrylate, ethylhexyl(meth)acrylate, phenoxyethyl(meth)acrylate, tetrahydrofurfuryl(meth)acrylate, hydroxyethyl(meth)acrylate, 2-hydroxypropyl(meth)acrylate, 2-hydroxy-3-chloropropyl(meth)acrylate, 4-hydroxybutyl(meth)acrylate, glycerol(meth)acrylate, 2-methoxyethyl(meth)acrylate, 3-methoxybutyl(meth)acrylate, ethoxydiethyleneglycol(meth)acrylate, methoxytriethyleneglycol(meth)acrylate, methoxytripropyleneglycol(meth)acrylate, poly(ethylene glycol)methylether(meth)acrylate, phenoxydiethyleneglycol(meth)acrylate, nonylphenoxypolyethyleneglycol(meth)acrylate, nonylphenoxypolypropyleneglycol(meth)acrylate, glycidyl(meth)acrylate, dicyclopentanyl(meth)acrylate, dicyclopentenyl(meth)acrylate, dicyclopentenyloxyethyl(meth)acrylate, isobonyl(meth)acrylate, adamentyl(meth)acrylate, stearyl(meth)acrylate, hexyl(meth)acrylate, heptyl(meth)acrylate, octyl(meth)acrylate, nonyl(meth)acrylate, decyl(meth)acrylate, lauryl(meth)acrylate, methyl α-hydroxymethyl acrylate, ethyl α-hydroxymethyl acrylate, propyl α-hydroxymethyl acrylate, and butyl α-hydroxymethyl acrylate; aromatic vinyls such as styrene, α-methylstyrene, (o,m,p)-vinyltoluene, (o,m,p)-methoxystyrene, and (o,m,p)-chlorostyrene; unsaturated ethers such as vinyl methyl ether, vinyl ethyl ether, and allyl glycidyl ether; unsaturated imides such as N-phenyl maleimide, N-(4-chlorophenyl) maleimide, N-(4-hydroxyphenyl) maleimide, and N-cyclohexyl maleimide; and maleic anhydrides such as maleic anhydride and methylmaleic anhydride. It is effective to use two or more selected from among the above monomers. Particularly, the acrylic binder may include 1-30 molar equivalents of a substituted monomer having 6 to 18 carbon atoms, but is not limited thereto.

The monomer that imparts alkali solubility may preferably be one or more selected from the group consisting of (meth)acrylic acid, crotonic acid, itaconic acid, maleic acid, fumaric acid, monomethyl maleic acid, 5-nobonen-2-carboxylic acid, mono-2-((meth)acryloyloxy)ethyl phthalate, mono-2-((meth)acryloyloxy)ethyl succinate, and co-carboxypolycaprolactone mono(metha)acrylate, but is not limited thereto.

In an embodiment of the present specification, the acrylic binder has an acid value of 10 to 200 KOH mg/g.

When the acid value of the acrylic binder is 10 KOH mg/g or more, the composition will have good solubility in an alkali developing solution, whereby the developing time of the composition will be reduced and no residue will remain on a substrate, and when the acid value is 200 KOH mg/g or less, the desorption of the pattern can be prevented, the straightness of the pattern can be ensured, and the taper angle of the pattern will not exceed 90°.

The acrylic binder may have an acid value of 30 to 150 KOH mg/g.

When the acid value of the acrylic binder is 30 KOH mg/g or more, development will not fail, and when the acid value is 150 KOH mg/g or less, development of the pattern without the loss of the pattern can be ensured.

In an embodiment of the present specification, the acrylic binder has a weight-average molecular weight of 1,000 to 50,000.

When the weight-average molecular weight of the acrylic binder is 1,000 or more, the binder will have a good binding function, and the pattern can resist physical external force, and thus is not lost, and can satisfy fundamental physical properties such as heat resistance and chemical resistance. When the weight-average molecular weight of the acrylic binder is 50,000 or less, the composition will have good developability in an alkali developing solution, and it will have good flowability, whereby the coating thickness can be controlled and the uniformity of the coating thickness can be ensured.

The weight-average molecular weight of the acrylic binder may be 2,000 to 30,000.

When the weight-average molecular weight of the acrylic binder is 2,000 or higher, a film can be sufficiently formed, and when the weight-average molecular weight of the acrylic binder is 30,000 or lower, a film can be sufficiently formed without the loss of the pattern, and chemical resistance can be ensured.

In an embodiment of the present specification, the content of the alkali-soluble binder is 1 to 20 parts by weight based on 100 parts by weight of the photosensitive resin composition.

When the content of the alkali-soluble binder is 1 part by weight or more, the adhesion of the formed pattern is not reduced, and patterning with an aqueous alkali solution is possible, and when the content of the alkali-soluble binder is 20 parts by weight or less, the intensity and sensitivity of the formed image are not reduced, and the pattern is not lost during development.

The content of the alkali-soluble binder may be 1 to 10 parts by weight based on 100 parts by weight of the photosensitive resin composition.

When the content of the alkali-soluble binder is 10 parts by weight or less, the development of the pattern without the loss of the pattern can be ensured.

In an embodiment of the present specification, the crosslinkable compound is a multifunctional monomer having an ethylenically unsaturated double bond.

The crosslinkable compound may be one or more of a compound that has a boiling point of 100° C. or higher and that contains one or more addition-polymerizable unsaturated groups in the molecule, and a multifunctional monomer containing caprolactone introduced therein.

The compound having a boiling point of 100° C. or higher and containing one or more addition-polymerizable unsaturated groups in the molecule may be one or more selected from the group consisting of monofunctional monomers such as polyethyleneglycol mono(meth)acrylate, polypropyleneglycol mono(meth)acrylate, and phenoxyethyl(meth)acrylate; and multifunctional monomers such as polyethyleneglycol (meth)acrylate, polypropyleneglycol(meth)acrylate, trimethylolethane triacrylate, trimethylolpropane triacrylate, neopentylglycol(meth)acrylate, pentaerythritol tetraacrylate, pentaerythritol triacrylate, dipentaerythritol pentaacrylate, and dipentaerythritol hexaacrylate, but is not limited thereto.

The multifunctional monomer containing caprolactone introduced therein may be one or more selected from the group consisting of compounds introduced into dipentaerythritol, such as KAYARAD DPCA-20, KAYARAD DPCA-30, KAYARAD DPCA-60 and KAYARAD DPCA-120; compounds introduced into tetrahydrofurfuryl acrylate, such as KAYARAD TC-110S; compounds introduced into neopentyl glycol hydroxypivalate, such as KAYARAD HX-220 and KAYARAD HK-620; epoxy ester 200PA, epoxy ester 3002M, epoxy ester 3002A and epoxy ester 3000M (manufactured by Kyoeisha Chemical Co., Ltd.); and urethane acrylates, such as UA306H, UA306T, UA306I, UA510H, UF8001, U-324A, U15HA and U-4HA (manufactured by Kyoeisha Chemical Co., Ltd.), but is not limited thereto.

In an embodiment of the present specification, the content of the crosslinkable compound is 1-10 parts by weight based on 100 parts by weight of the photosensitive resin composition.

When the content of the crosslinkable compound is 1 part by weight or more, it has the effect of preventing any decrease in photosensitivity or strength of the coated film, and when the content of the crosslinkable compound is 10 parts by weight or less, it has the effect of preventing an excessive increase in the adhesion of the photosensitive layer, thereby making the strength of the film sufficient and preventing the pattern from being lost during development.

In an embodiment of the present specification, the photopolymerization initiator is one or more selected from the group consisting of an acetophenone-based compound, a biimidazole-based compound, a triazine-based compound, and an oxime-based compound.

The acetophenone-based compound may be one or more selected from the group consisting of 2-hydroxy-2-methyl-1-phenylpropan-1-one, 1-(4-isopropylphenyl)-2-hydroxy-2-methylpropan-1-one, 4-(2-hydroxyethoxy)-phenyl-(2-hydroxy-2-propyl)ketone, 1-hydroxycyclohexylphenylketone, benzoin methyl ether, benzoin ethyl ether, benzoin isobutyl ether, benzoin butyl ether, 2,2-dimethoxy-2-phenylacetophenone, 2-methyl-(4-methylthio)phenyl-2-morpholino-1-propan-1-one, 2-benzyl-2-dimethylamino-1-(4-morpholinophenyl)-butan-1-one, 2-(4-bromo-benzyl-2-dimethylamino-1-(4-morpholinophenyl)-butan-1-one, and 2-methyl-1-[4-(methylthio)phenyl]-2-morpholinopropan-1-one, but is not limited thereto.

The biimidazole-based compound may be one or more selected from the group consisting of 2,2-bis(2-chlorophenyl)-4,4',5,5'-tetraphenyl biimidazole, 2,2'-bis(o-chlorophenyl)-4,4',5,5'-tetrakis(3,4,5-trimethoxyphenyl)-1,2'-biimidazole, 2,2'-bis(2,3-dichlorophenyl)-4,4',5,5'-tetraphenyl biimidazole, and 2,2'-bis(o-chlorophenyl)-4,4,5,5'-tetraphenyl-1,2'-biimidazole, but is not limited thereto.

The triazine-based compound may be one or more selected from the group consisting of 3-{4-[2,4-bis(trichloromethyl)-s-triazine-6-yl]phenylthio}propionic acid, hexafluoroisopropyl-3-{4-[2,4-bis(trichloromethyl)-s-triazine-6-yl]phenylthio}propionate, ethyl-2-{4-[2,4-bis(trichloromethyl)-s-triazine-6-yl]phenylthio}acetate, 2-epoxyethyl-2-{4-[2,4-bis(trichloromethyl)-s-triazine-6-yl]phenylthio}acetate, cyclohexyl-2-{4-[2,4-bis(trichloromethyl)-s-triazine-6-yl]phenylthio}acetate, benzyl-2-{4-[2,4-bis(trichloromethyl)-s-triazine-6-yl]phenylthio}acetate, 3-{chloro-4-[2,4-bis(trichloromethyl)-s-triazine-6-yl] phenylthio}propionic acid, 3-{4-[2,4-bis(trichloromethyl)-s-triazine-6-yl]phenylthio}propionamide, 2,4-bis(trichloromethyl)-6-p-methoxystyryl-s-triazine, 2 bis(trichloromethyl)-6-(1-p-dimethylaminophenyl)-1,3,-butadienyl-s-triazine, and 2-trichloromethyl-4-amino-6-p-methoxystyryl-s-triazine, but is not limited thereto.

The oxime-based compound may be one or more selected from the group consisting of 1,2-octadione-1-(4-phenylthio) phenyl-2-(o-benzoyloxime) (CGI 124 manufactured by Ciba-Geigy), ethanone-1-(9-ethyl)-6-(2-methylbenzoyl-3-yl)-1-(o-acetyloxim) (CGI 242 manufactured by Ciba-Geigy), and N-1919 (manufactured by Adeka Corp.), but is not limited thereto.

In an embodiment of the present specification, the content of the photopolymerization initiator is 0.1 to 10 parts by weight based on 100 parts by weight of the photosensitive resin composition.

When the content of the photopolymerization initiator is 0.1 parts by weight or more, the effect of addition thereof will occur, and when the content is 10 parts by weight or less, the effect of addition thereof will further increase.

The photopolymerization initiator serves as an initiator in a process of exposing a negative photoresist to light and forms radicals upon exposure to light, and a resist film is formed by the chain reaction of the radicals.

In an embodiment of the present invention, the content of the photopolymerization initiator in the photosensitive resin composition is 1 to 300 parts by weight based on 100 parts by weight of the sum of the binder and the multifunctional monomer having the ethylenically unsaturated double bond.

The photopolymerization initiator that is used in the present specification may be one or a mixture of two or more selected from among an acetophenone-based compound, a biimidazole-based compound, a triazine-based compound, and an oxime-based compound.

The photopolymerization initiator can be selected in consideration of a combination of developability, pattern properties and exposure wavelength, and the oxime-based initiator that uses even light in a long-wavelength region has good initiation efficiency.

The content of the acetophenone-based compound may be 1 to 300 parts by weight, and preferably 1 to 200 parts by weight.

The content of the biimidazole-based compound may be 1 to 300 parts by weight, and preferably 1 to 100 parts by weight.

The content of the triazine-based compound may be 1 to 300 parts by weight, and preferably 1 to 100 parts by weight.

The content of the oxime-based compound may be 1 to 300 parts by weight, and preferably 1 to 50 parts by weight.

In an embodiment of the present specification, the photopolymerization initiator may contain, as an auxiliary component, a photocrosslinking sensitizer for promoting the generation of radicals, or a curing accelerator for accelerating curing.

The photopolymerization initiator may contain, as an auxiliary component, both the photocrosslinking sensitizer and the curing accelerator.

The content of the photocrosslinking sensitizer or the curing accelerator may be 0.01 to 10 parts by weight based on 100 parts by weight of the photopolymerization initiator.

When the content of the photopolymerization initiator is 0.01 parts by weight or more, the effect of addition thereof will occur, and when the content is 10 parts by weight or less, the effect of addition thereof will further increase.

As used herein, the term "photocrosslinking sensitizer" refers to a material functioning to receive energy and transfer triplet energy to other molecules.

For example, a material showing good absorption at a relatively long wavelength (365 nm, I-Line) can receive energy and transfer energy to an initiator that reacts with light at a wavelength of 315 nm.

The photocrosslinking sensitizer may be one or more selected from the group consisting of benzophenone-based compounds such as benzophenone, bis(dimethylamino)benzophenone, bis(diethylamino)benzophenone, 2,4,6-trimethylaminobenzophenone, methyl-o-benzoyl benzoate, 3,3-dimethyl-4-methoxybenzophenone, and 3,3,4,4-tetra(t-butylperoxycarbonyl)benzophenone; fluorenone-based compounds such as 9-fluorenone, 2-chloro-9-fluorenone, and 2-methyl-9-fluorenone; thioxanthone-based compounds such as thioxanthone, 2,4-diethyl thioxanthone, 2-chloro thioxanthone, 1-chloro-4-propyloxy thioxanthone, isopropylthioxanthone, and diisopropylthioxanthone; xanthone-based compounds such as xanthone and 2-methylxanthone; anthraquinone-based compounds such as anthraquinone, 2-methyl anthraquinone, 2-ethyl anthraquinone, t-butyl anthraquinone, and 2,6-dichloro-9,10-anthraquinone; acridine-based compounds such as 9-phenylacridine, 1,7-bis(9-acridinyl)heptane, 1,5-bis(9-acridinylpentane), and 1,3-bis(9-acridinyl)propane; dicarbonyl compounds such as benzyl, 1,7,7-trimethyl-bicyclo[2,2,1]heptane-2,3-dion, and 9,10-phenanthrenequinone; phosphine oxide-based compounds such as 2,4,6-trimethylbenzoyl diphenylphosphine oxide and bis(2,6-dimethoxybenzoyl)-2,4,4-trimethylpentylphosphine oxide; benzoate-based compounds such as methyl-4-(dimethylamino)benzoate, ethyl-4-(dimethylamino)benzoate, and 2-n-butoxyethyl-4-(dimethylamino)benzoate; amino synergists such as 2,5-bis(4-diethylaminobenzal)cyclopentanone, 2,6-bis(4-diethylaminobenzal)cyclohexanone, and 2,6-bis(4-diethylaminobenzal)-4-methyl-cyclopentanone; coumarin-based compounds such as 3,3-carbonylvinyl-7-(diethylamino)coumarin, 3-(2-benzothiazolyl)-7-(diethylamino)coumarin, 3-benzoyl-7-(diethylamino)coumarin, 3-benzoyl-7-methoxy-coumarin, and 10,10-carbonylbis[1,1,7,7-tetramethyl-2,3,6,1-tetrahydro-1H,5H,11H-C1]-benzopyrano[6,7,8-ij]-quinolizin-11-one; chalcone compound such as 4-diethylamino chalcone and 4-azidbenzalacetophenone: 2-benzoylmethylene, and 3-methyl-b-naphthothiazoline, but is not limited thereto.

The curing accelerator may be one or more selected from the group consisting of 2-mercaptobenzoimidazole, 2-mercaptobenzothiazol, 2-mercaptobenzooxazole, 2,5-dimercapto-1,3,4-thiadiazole, 2-mercapto-4,6-dimethylaminopyridine, pentaerythritol-tetrakis(3-mercaptopropionate), pentaerythritol-tris(3-mercaptopropionate), pentaerythritol-tetrakis(2-mercaptoacetate), pentaerythritol-tris(2-mercaptoacetate), trimethylolpropane-tris(2-mercaptoacetate), and trimethylolpropane-tris(3-mercaptopropionate), but is not limited thereto.

In an embodiment of the present specification, the solvent can be selected in consideration of solubility, pigment dispersibility, applicability and the like.

The solvent may be one or a mixture of two or more selected from the group consisting of methyl-3-methoxy propionate (144° C.), ethyleneglycol methylether (125° C.), ethyleneglycol ethylether (135° C.), ethyleneglycol diethylether (121° C.), dibutylether (140° C.), ethyl pyruvate (144° C.), propyleneglycol methylether (121° C.), propyleneglycol methylether acetate (146° C.), n-butyl acetate (125° C.), isobutyl acetate (116° C.), amyl acetate (149° C.), isoamyl acetate (143° C.), butyl propionate (146° C.), isoamyl propionate (156° C.), ethyl butyrate (120° C.), propyl butyrate (143° C.), methyl-3-methoxyisobutyrate (148° C.), methyl glycolate (150° C.), methyl lactate (145° C.), ethyl lactate (154° C.), methyl-2-hydroxyisobutyrate (137° C.), ethylethoxy acetate (156° C.), 2-methoxyethyl acetate (145° C.), ethyleneglycol methylether acetate (145° C.), 2-ethoxyethylacetate (156° C.), dibutylether (140° C.), cyclopentanone (131° C.), cyclohexanone (155° C.), 2-hexanone (127° C.), 3-hexanone (123° C.), 5-methyl-2-hexanone (145° C.), 2-heptanone (150° C.), 3-heptanone (148° C.), 4-heptanone (145° C.), 2-methyl-3-heptanone (159° C.), 1-methoxy-2-propanol (118° C.), ethyl-2-hydroxy-propionate (154° C.), ethyl-3-methoxypropionate (158° C.), 2-methoxyethylether (162° C.), 3-methoxybutylacetate (170° C.), 2-ethoxyethyl ether (185° C.), 2-butoxyethanol (171° C.), 3-ethoxy-propanol (161° C.), diethylene glycol dodecylether (169° C.), dipropylene glycol methylether (188° C.), 2,6-dimethyl-4-hepatanone (169° C.), 2-octanone (173° C.), 3-octanone (168° C.), 3-nonanone (188° C.), 5-nonanone (187° C.), 4-hydroxy-4-methyl-2-pentanone (166° C.), 2-methylcyclohexanone (163° C.), 3-methylcyclohexanone (170° C.), 4-methylcyclohexanone (170° C.), 2,6-dimethylcyclohexanone (175° C.), 2,2,6-trimethylcyclohexanone (179° C.), cycloheptanone (179° C.), hexyl acetate (169° C.), amyl butyrate (185° C.), isopropyl lactate (167° C.), butyl lactate (186° C.), ethyl-3-hydroxybutyrate (170° C.), ethyl-3-ethoxybutyrate (170° C.), ethyl-3-hydroxybutyrate (180° C.), propyl-2-hydroxypropionate (169° C.), propyleneglycol diacetate (186° C.), propyleneglycol butylether (170° C.), propyleneglycol methylether propionate (160° C.), diethyleneglycol dimethyl ether (162° C.), diethyleneglycol dimethyl ether acetate (165° C.), dipropyleneglycol methylether (188° C.), dipropyleneglycol dimethylether (171° C.), ethyleneglycol butylether (171° C.), diethyleneglycol methylethylether (176° C.), diethyleneglycol methylisopropylether (179° C.), diethyleneglycol diethylether (189° C.), butyl butyrate (165° C.), ethyl-3-ethoxypropionate (170° C.), diethyleneglycol monomethylether (194° C.), 4-ethylcyclohexanone (193° C.), 2-butoxyethyl acetate (192° C.), diethyleneglycol monoethylether (202° C.), butyrolactone (204° C.), hexyl butyrate (205° C.), diethyleneglycol methylether acetate (209° C.), diethyleneglycol butyl methyl ether (212° C.), tripropylglycol dimethyl ether (215° C.), triethyleneglycol dimethylether (216° C.), diethyleneglycol ethylether acetate (217° C.), diethyleneglycol butylether acetate (245° C.), 3-epoxy-1,2- propanediol (222° C.), ethyl-4-acetylbutyrate (222° C.), diethyleneglycol monobutylether (231° C.), tripropylglycol methyl ether (242° C.), diethyleneglycol (245° C.), 2-(2-butoxyethoxy)ethyl acetate (245° C.), catechol (245° C.), triethyleneglycol methylether (249° C.), diethyleneglycol dibutylether (256° C.), triethyleneglycol ethylether (256° C.), diethyleneglycol monoheptylether (260° C.), triethyleneglycol butyl methy ether (261° C.), triethyleneglycol butylether (271° C.), tripropylglycol (273° C.) and tetraethyleneglycol dimethylether (276° C.), the temperature in parentheses being the boiling point of the solvent.

When the solvent is composed only of a material having a low boiling point, the film can be dried quickly in a vacuum chamber drying process (VCD) after coating, which can cause VCD defects. In the case of a spin-type composition, the effect of washing an edge bead remover (EBR) can be reduced, and in the case of a spinless-type composition, a solution in a coater can be dried, which can cause protrusions. To prevent these phenomena, the solvent that is used in the present specification may be a mixture of two or more of the above-mentioned solvents.

The colorant may be added directly to the photosensitive resin composition, or a composition containing the colorant may also be added to the photosensitive resin composition.

The colorant composition may contain the colorant and at least one of a binder, a solvent and a dispersing agent.

In an embodiment of the present specification, the colorant that is used in the present invention may be a black pigment alone or a mixture of a black pigment and a coloring pigment.

The black pigment may be carbon black having a surface resistance of $10^{11}$ Ω·cm or higher, obtained by treating carbon black to impart it with high resistance, or may be a mixture of carbon black and an organic black pigment. When the organic black pigment is added to the black pigment, it will increase the average optical density and adjust the average optical density (OD) to be uniform at each unit wavelength, so that the composition will have high light-shielding properties.

The carbon black may be one or a mixture of two or more selected from among Cisto 5HIISAF-HS, Cisto KH, Cisto 3HHAF-HS, Cisto NH, Cisto 3M, Cisto 300HAF-LS, Cisto 116HMMAF-HS, Cisto 116MAF, Cisto FMFEF-HS, Cisto SOFEF, Cisto VGPF, Cisto SVHSRF-HS, and Cisto SSRF, which are manufactured by Donghae Carbon, Co., Ltd.; BK_8132 manufactured by Tokushiki Co. Ltd.; Diagram black II, Diagram black N339, Diagram black SH, Diagram black H, Diagram LH, Diagram HA, Diagram SF, Diagram N550M, Diagram Diagram E, Diagram G, Diagram R, Diagram N760M, Diagram LR, #2700, #2600, #2400, #2350, #2300, #2200, #1000, #980, #900, MCF88, #52, #50, #47, #45, #45L, #25, #CF9, #95, #3030, #3050, MA7, MA77, MA8, MA11, MA100, MA40, OIL7B, OIL9B, OIL11B, OIL30B, and OIL31B, which are manufactured by Mitsubishi Chemical, Co., Ltd.; PRINTEX-U, PRINTEX-V, PRINTEX-140U, PRINTEX-140V, PRINTEX-95, PRINTEX-85, PRINTEX-75, PRINTEX-55, PRINTEX-45, PRINTEX-300, PRINTEX-35, PRINTEX-25, PRINTEX-200, PRINTEX-40, PRINTEX-30, PRINTEX-3, PRINTEX-A, SPECIAL BLACK-550, SPECIAL BLACK-350, SPECIAL BLACK-250, SPECIAL BLACK-100, and LAMP BLACK-101, which are manufactured by Degussa Corp.; and RAVEN-1100ULTRA, RAVEN-1080ULTRA, RAVEN-1060ULTRA, RAVEN-1040, RAVEN-1035, RAVEN-1020, RAVEN-1000, RAVEN-890H, RAVEN-890, RAVEN-880ULTRA, RAVEN-860ULTRA, RAVEN-850, RAVEN-820, RAVEN-790ULTRA, RAVEN-780ULTRA, RAVEN-760ULTRA, RAVEN-520, RAVEN-500, RAVEN-460, RAVEN-450, RAVEN-430ULTRA, RAVEN-420, RAVEN-410, RAVEN-2500ULTRA, RAVEN-2000, RAVEN-1500, RAVEN-1255, RAVEN-1250, RAVEN-1200, RAVEN-1190ULTRA, and RAVEN-1170, which are manufactured by Columbia Carbon Co., Ltd.

The organic black pigment may have a surface resistance of $10^{11}$ Ω·cm or higher.

The present specification also provides a photosensitive resin composition for a touch bezel, which comprises the organic black pigment having a surface resistance of $10^{11}$ Ω·cm or higher.

The organic black pigment having a surface resistance of $10^{11}$ Ω·cm or higher may be lactam black, aniline black or perylene black.

In an embodiment of the present specification, the content of the colorant is 2 to 12 parts by weight based on 100 parts by weight of the photosensitive resin composition.

When the content of the colorant is 2 parts by weight or more, the formed film will have sufficient light-shielding properties, because the optical density of the film does not decrease, and when the content of the colorant is 12 parts by weight or less, the composition will have good developing properties, and no residue will remain.

Examples of a coloring pigment that may be used in a mixture with the black pigment include carmine 6B (C.I. 12490), phthalocyanine green (C.I. 74260), halocyanine blue (C.I. 74160), perylene black (BASF K0084. K0086), cyanine black, linol yellow (C.I. 21090), linol yellow GRO 21090), benzidine yellow 4T-564D, victoria pure blue 42595), C.I. PIGMENT RED 97, 122, 149, 168, 177, 180, 192 and 215, C.I. PIGMENT GREEN 7 and 36, C.I. PIGMENT 15:1, 15:4, 15:6, 22, 60 and 64, C.I. PIGMENT yellow 83 and 139, C.I. PIGMENT VIOLET 23 and the like, as well as a white pigment, a fluorescent pigment and the like.

In embodiment of the present specification, the photosensitive resin composition may further comprise one or more primary additives selected from among a surfactant, a dispersing agent, an antioxidant, a UV absorber, a thermal polymerization inhibitor, and a leveling agent. These additives may be any materials known in the art.

Examples of the surfactant include, but are not limited to, MCF 350SF, F-475, F-488 and F-552, which are manufactured by DIC Co. Ltd.

The dispersing agent can be added to the inside or outside of the pigment by treating the surface of the pigment with the dispersing agent.

The dispersing agent that is used in the present specification may be a polymeric, non-ionic, anionic or cationic dispersing agent. Non-limiting examples of the dispersing agent include polyalkyleneglycol and its ester, polyoxyalkylene polyhydric alcohol, ester alkylene oxide adducts, alcohol alkylene oxide adducts, sulfonic ester, sultanate, carboxylic ester, carboxylate, alkylamide alkylene oxide adducts, alkylamine and the like. Among them, a mixture of two or more may be used, but the scope of the present specification is not limited thereto.

Non-limiting examples of the antioxidant include 2,2-thiobis(4-methyl-6-t-butylphenol), 2,6-g,t-butylphenol and the like.

Non-limiting examples of the UV-absorbing agent include 2-(3-t-butyl-5-methyl-2-hydroxyphenyl)-5-chloro-benzotriazole, alkoxy benzophenone and the like.

Non-limiting examples of the thermal polymerization inhibitor include 2-mercaptoimidazole, p-methoxyphenol, di-t-butyl-p-cresol, pyrogarol, t-butylcatechol, benzoquinone, 4, thiobis(3-methyl-6-t-butylphenol), 2,2-methylenebis(4-methyl-6-t-butylphenol), 2-mercaptoimidazole, and a mixture of two or more thereof.

In addition, the photosensitive resin composition may further comprise one or more secondary additives selected from the group consisting of a carbon black dispersion, resin binder having functionality, a monomer, a radiation-sensitive compound, and other additives.

In an embodiment of the present specification, the content of the additive is more than 0 parts by weight, but not more than 5 parts by weight, based on 100 parts by weight of the composition.

The present specification also provides a pattern formed using the photosensitive resin composition.

The pattern may be a bezel pattern, preferably a bezel pattern formed in a display panel, and more preferably a bezel pattern formed in a touch panel.

In an embodiment of the present specification, the pattern has a layer thickness of 0.3 μm to 5 μm.

When the pattern has a layer thickness of 0.3 μm to 5 μm, a short circuit in a metal wiring is prevented.

The pattern may have a layer thickness of 0.8 μm to 3 μm.

When the layer thickness of the pattern is 0.8 μm or more, the light-shielding properties are not decreased, and when it is 3 μm or less, the light-shielding properties can be ensured.

The layer thickness of the pattern may be 1.5 μm to 2.0 μm in view of the light-shielding properties.

In an embodiment of the present specification, the pattern formed using the photosensitive resin composition of the present specification has an optical density (OD) of 3.0 or higher in a visible wavelength range (380 to 780 nm).

The pattern formed using the photosensitive resin composition of the present specification may have an optical density (OD) of 3.5 or higher in a visible wavelength range (380 to 780 nm).

The pattern formed using the photosensitive resin composition of the present specification may have an optical density (OD) of 4.0 or higher in a visible wavelength range (380 to 780 nm).

In an embodiment of the present specification, the pattern is formed by a method comprising the steps of: applying the photosensitive resin composition to a substrate; and exposing and developing the applied resin composition.

The present specification also provides a method for fabricating the pattern.

In an embodiment of the present specification, the method for fabricating the pattern comprises the steps of: applying the photosensitive resin composition to a substrate; and exposing and developing the applied resin composition.

The substrate may be made of a glass, plastic or metal material, but is not limited thereto.

The step of applying the photosensitive resin composition can be performed using a spray method, a roll coating method, a spin coating method, a bar coating method or a slit coating method.

After the step of applying the photosensitive resin composition, the solvent can be removed by pre-baking, thereby forming a film. The pre-baking can be performed at a temperature ranging from 70 to 150° C. for 0.5 to 30 minutes.

After pre-baking, the applied photosensitive resin layer is exposed to light using, for example, a photomask having a desired pattern, and then the exposed photosensitive resin layer is developed with a suitable developing solution, thereby fabricating a bezel layer.

The development of the exposed resin layer can be performed using a dipping method, a shower method, a spray method, a paddle method or the like. The development time may be about 30 to 180 seconds.

Examples of the developing solution that is used in the present invention include aqueous solutions of inorganic alkalis such as sodium hydroxide, potassium hydroxide, sodium silicate, sodium methsilicate or ammonia; aqueous solutions of primary amines such as ethylamine or N-propylamine; aqueous solutions of secondary amines such as diethylamine or di-n-propylamine; aqueous solutions of tertiary amines such as trimethylamine, methyldiethylamine dimethylethyldiamine; aqueous solutions of tertiary alcoholamines such as dimethylethanolamine, methyldiethanolamine or triethanolamine; aqueous solutions of tertiary cyclic amines such as pyrrole, piperidine, n-methylpiperidine, n-methylpyrrolidine, 1,8-diazabicyclo[5.4.0]-7-undecene or 1,5-diazabicyclo[4.3.0]-5-nonene; aqueous solutions of aromatic tertiary amines such as pyridine, coridine, lutidine or quinoline; and aqueous solutions of quaternary ammonium salts such as tetramethylammonium hydroxide or tetraethylammonium hydroxide.

After development, the layer is washed with running water for about 30 to 90 seconds and dried in air or nitrogen, thereby forming a pattern. The pattern may be post-baked using a heating device such as a hot plate or an oven, thereby obtaining a bezel layer.

The present specification also provides a display panel.

In an embodiment of the present specification, the display panel comprises the above-described pattern.

The display panel may specifically be a display panel comprising the above-described bezel pattern, and more specifically a touch panel comprising the bezel pattern.

Hereinafter, the present specification will be described in further detail with reference to Examples, Comparative Examples and Experimental Examples. It is to be understood, however, that these Examples, Comparative Examples and Experimental Examples are presented for illustrative purposes only, and are not intended to limit the scope of the present specification.

Example 1

10 parts by weight of a carbon dispersion (consisting of 20 parts by weight of carbon dispersed in 100 parts by weight of BK_8132, manufactured by Tokyshiki Co. Ltd.) was mixed with part by weight of benzylmethacrylate/N-phenylmaleimide/styrene/glycidyl methacrylate/methacrylic acid (molar ratio: 38/7/7/21/27; weight-average molecular weight Mw=9000; acid value: 105 KOH mg/g; solid content: 30 parts by weight based on 100 parts by weight of a polymerized binder) as an alkali-soluble acrylic binder 1, 3 parts by weight of benzylmethacrylate/N-phenylmaleimide/styrene/laurylmethacrylate/methacrylic acid (molar ratio: 40/7/8/14/31; weight-average molecular weight Mw=19000; acid value: 124 KOH mg/g; solid content: 30 parts by weight based on 100 parts by weight of a polymerized binder) as an acrylic binder 2, 1.8 parts by weight of dipentaerythritol hexaacrylate as a multifunctional monomer, 1.5 parts by weight of N-1919 (manufactured by Adeka Corp.) as a photopolymerization initiator, 0.1 parts by weight of SQ506 (epoxide equivalent weight: 350 g/eq; manufactured by Arakawa Co., Ltd.) as an epoxy adhesion promoter, 0.1 parts by weight of F-475 (manufactured by DIC Co., Ltd.) as a leveling agent, and 26.5 parts by weight of propyleneglycol monomethylether acetate and 56 parts by weight of 3-methoxybutyl acetate as solvents.

Then, the mixture was stirred for 5 hours to obtain a photosensitive resin composition.

The obtained photosensitive resin composition was spin-coated on a metal substrate (ITO substrate) and then pre-baked at about 100° C. for 2 minutes to form a film having a thickness of about 1.44 μm. Next, the film on the substrate was cooled at room temperature and exposed to light using a photomask with energy of about 100 mJ/cm² under a high-pressure mercury lamp. The exposed substrate was developed in a 0.04% aqueous solution of KOH at a temperature of 25° C. using a spray method, and was washed with pure water, dried, and post-baked in a convection oven at 230° C. for 20 minutes.

The film obtained as described above was a clean film that developed no surface defects in any of the fabrication processes. In addition, the film had a thickness of 1.31 μm and an optical density (OD) of 5.0, indicating that a bezel layer having good straightness could be ensured.

Example 2

10 parts by weight of a carbon dispersion (consisting of 20 parts by weight of carbon dispersed in 100 parts by weight of BK_8132 manufactured by Tokyshiki Co. Ltd.) was mixed with 1 part by weight of benzylmethacrylate/N-phenylmaleimide/styrene/glycidyl methacrylate/methacrylic acid (molar ratio: 38/7/7/21/27; weight-average molecular weight Mw=9000; acid value: 105 KOH mg/g; solid content: 30 parts by weight based on 100 parts by weight of a polymerized binder) as an alkali-soluble acrylic binder 1, 2 parts by weight of benzylmethacrylate/N-phenylmaleimide/styrene/laurylmethacrylate/methacrylic acid (molar ratio: 40/7/8/14/31; weight-average molecular weight Mw=19000; acid value: 124 KOH mg/g; solid content: 30 parts by weight based on 100 parts by weight of a polymerized binder) as an acrylic binder 2, 1 part by weight of EOCN-70 (Nippon Kayaku; epoxide equivalent weight: 198 g/eq) as a cresol novolac type epoxy resin, 1.8 parts by weight of dipentaerythritol hexaacrylate as a multifunctional monomer, 1.5 parts by weight of N-1919 (manufactured by Adeka Corp.) as a photopolymerization initiator, 0.1 parts by weight of SQ506 (epoxide equivalent weight: 350 g/eq; manufactured by Arakawa Co., Ltd.) as an epoxy adhesion promoter, 0.1 parts by weight of F-475 (manufactured by DIC Co., Ltd.) as a leveling agent, and 26.5 parts by weight of propyleneglycol monomethylether acetate and 56 parts by weight of 3-methoxybutyl acetate as solvents.

Then, the mixture was stirred for 5 hours to obtain a photosensitive resin composition.

The obtained photosensitive resin composition was spin-coated on a metal substrate (ITO substrate) and then pre-baked at about 100° C. for 2 minutes to form a film having a thickness of about 1.44 μm. Next, the film on the substrate was cooled at room temperature and exposed to light using a photomask with energy of about 100 mJ/cm² under a high-pressure mercury lamp. The exposed substrate was developed in a 0.04% aqueous solution of KOH at a temperature of 25° C. using a spray method, and was washed with pure water, dried, and post-baked in a convection oven at 230° C. for 20 minutes.

The film obtained as described above was a clean film that developed no surface defects in any of the fabrication processes. In addition, the film had a thickness of 1.31 μm and an optical density (OD) of 5.0, indicating that a bezel layer having good straightness could be ensured.

Example 3

10 parts by weight of a carbon dispersion (consisting of 20 parts by weight of carbon dispersed in 100 parts by weight of BK_8132 manufactured by Tokyshiki Co. Ltd.) was mixed with 1 part by weight of benzylmethacrylate/N-phenylmaleimide/styrene/glycidyl methacylate/methacrylic acid (molar ratio: 38/7/7/21/27; weight-average molecular weight Mw=9000; acid value: 105 KOH mg/g; solid content: 30 parts by weight based on 100 parts by weight of a polymerized binder) as an alkali-soluble acrylic binder 1, 2 parts by weight of benzylmethacrylate/N-phenylmaleimide/styrene/laurylmethacrylate/methacrylic acid (molar ratio: 40/7/8/14/31; weight-average molecular weight Mw=19000; acid value: 124 KOH mg/g; solid content: 30 parts by weight based on 100 parts by weight of a polymerized binder) as an acrylic binder 2, 1 part by weight of EOCN-70 (Nippon Kayaku; epoxide equivalent weight: 198 g/eq) as a cresol novolac type epoxy resin, 1.8 parts by weight of dipentaerythritol hexaacrylate as a multifunctional monomer, 1.5 parts by weight of N-1919 (manufactured by Adeka Corp.) as a photopolymerization initiator, 0.1 parts by weight of SQ502 (epoxide equivalent weight: 250 g/eq; manufactured by Arakawa Co., Ltd.) as an epoxy adhesion promoter, 0.1 parts by weight of F-475 (manufactured by DIC Co., Ltd.) as a leveling agent, and 26.5 parts by weight of propyleneglycol monomethylether acetate and 56 parts by weight of 3-methoxybutyl acetate as solvents.

Then, the mixture was stirred for 5 hours to obtain a photosensitive resin composition.

The obtained photosensitive resin composition was spin-coated on a metal substrate (ITO substrate) and then pre-baked at about 100° C. for 2 minutes to form a film having a thickness of about 1.44 μm. Next, the film on the substrate was cooled at room temperature and exposed to light using a photomask with energy of about 100 mJ/cm² under a high-pressure mercury lamp. The exposed substrate was developed in a 0.04% aqueous solution of KOH at a temperature of 25° C. using a spray method, and was washed with pure water, dried, and post-baked in a convection oven at 230° C. for 20 minutes.

The film obtained as described above was a clean film that developed no surface defects in any of the fabrication processes. In addition, the film had a thickness of 1.31 μm and an optical density (OD) of 5.0, indicating that a bezel layer having good straightness could be ensured.

Comparative Example 1

10 parts by weight of a carbon dispersion (consisting of 20 parts by weight of carbon dispersed in 100 parts by weight of BK_8132 manufactured by Tokyshiki Co. Ltd.) was mixed with 1 part by weight of benzylmethacrylate/N-phenylmaleimide/styrene/glycidyl methacylate/methacrylic acid (molar ratio: 38/7/7/21/27; weight-average molecular weight Mw=9000; acid value: 105 KOH mg/g; solid content: 30 parts by weight based on 100 parts by weight of a polymerized binder) as an alkali-soluble acrylic binder 1, 3 parts by weight of benzylmethacrylate/N-phenylmaleimide/styrene/laurylmethacrylate/methacrylic acid (molar ratio: 40/7/8/14/31; weight-average molecular weight Mw=19000; acid value: 124 KOH mg/g; solid content: 30 parts by weight based on 100 parts by weight of a polymerized binder) as an acrylic binder 2, 1.8 parts by weight of dipentaerythritol hexaacrylate as a multifunctional monomer, 1.5 parts by weight of N-1919 (manufactured by Adeka Corp.) as a photopolymerization initiator, 5 parts by weight of 3-methacryloxypropyltrimethoxysilane as an adhesion promoter, 0.1 parts by weight of F-475 (manufactured by DIC Co., Ltd.) as a leveling agent, and 26.6 parts by weight of propyleneglycol monomethylether acetate and 56 parts by weight of 3-methoxybutyl acetate as solvents.

Then, the mixture was stirred for 5 hours to obtain a photosensitive resin composition.

The obtained photosensitive resin composition was spin-coated on a metal substrate (ITO substrate) and then pre-baked at about 100° C. for 2 minutes to form a film having a thickness of about 1.44 μm. Next, the film on the substrate was cooled at room temperature and exposed to light using a photomask with energy of about 100 mJ/cm² under a high-pressure mercury lamp. The exposed substrate was developed in a 0.04% aqueous solution of KOH at a temperature of 25° C. using a spray method, and was washed with pure water, dried, and post-baked in a convection oven at 230° C. for 20 minutes.

The film obtained as described above could provide a bezel layer having a thickness of 1.31 μm.

Comparative Example 2

10 parts by weight of a carbon dispersion (consisting of 20 parts by weight of carbon dispersed in 100 parts by weight of BK_8132 manufactured by Tokyshiki Co. Ltd.) as a colorant composition was mixed with 1 part by weight of benzyl-methacrylate/N-phenylmaleimide/styrene/glycidyl methacy-late/methacrylic acid (molar ratio: 38/7/7/21/27; weight-average molecular weight Mw=9000; acid value: 105 KOH mg/g; solid content: 30 parts by weight based on 100 parts by weight of a polymerized binder) as an alkali-soluble acrylic binder 1, 3 parts by weight of benzylmethacrylate/N-phenyl-maleimide/styrene/laurylmethacrylate/methacrylic acid (molar ratio: 40/7/8/14/31; weight-average molecular weight Mw=19000; acid value: 124 KOH mg/g; solid content: 30 parts by weight based on 100 parts by weight of a polymerized binder) as an acrylic binder 2, 1.8 parts by weight of EOCN-70 (Nippon Kayaku; epoxide equivalent weight: 198 g/eq) as a cresol novolac type epoxy resin, 1.5 parts by weight of dipentaerythritol hexaacrylate as a multifunctional monomer, 5 parts by weight of N-1919 (manufactured by Adeka Corp.) as a photopolymerization initiator, 5 parts by weight of 3-methacryloxypropyltrimethoxysilane as an adhesion promoter, 0.1 parts by weight of F-475 (manufactured by DIC Co., Ltd.) as a leveling agent, and 26.6 parts by weight of propyleneglycol monomethylether acetate and 56 parts by weight of 3-methoxybutyl acetate as solvents.

Then, the mixture was stirred for 5 hours to obtain a photosensitive resin composition.

The obtained photosensitive resin composition was spin-coated on a metal substrate (ITO substrate) and then pre-baked at about 100° C. for 2 minutes to form a film having a thickness of about 1.44 μm. Next, the film on the substrate was cooled at room temperature and exposed to light using a photomask with energy of about 100 mJ/cm² under a high-pressure mercury lamp. The exposed substrate was developed in a 0.04% aqueous solution of KOH at a temperature of 25° C. using a spray method, and was washed with pure water, dried, and post-baked in a convection oven at 230° C. for 20 minutes.

The film obtained as described above was a clean film that developed no surface defects in any of the fabrication processes. In addition, the film could provide a bezel layer having a thickness of 1.31 μm.

Experimental Example

Evaluation of Chemical Resistance and Adhesion to Metal

The substrates having the bezel layer formed thereon, obtained in each of Examples 1 to 3 and Comparative Example 1, were immersed sequentially in an etchant and a stripper, which are used to form a metal pattern, after which the adhesion of the bezel layer was examined to evaluate whether the bezel layer was peeled from the metal substrate (ITO substrate). The results of the evaluation are shown in Table 1 below.

TABLE 1

| | Content of epoxy binder | Content of epoxy adhesion promoter | Peeling after chemical resistance test | | | | | |
|---|---|---|---|---|---|---|---|---|
| | | | Step-1 etchant 1 | Step-2 stripper 1 | Step-3 etchant 2 | Step-4 stripper 2 | Step-5 etchant 3 | Step-6 stripper 3 |
| Example 1 | 0 | 5 | ◯ | ◯ | ◯ | ◯ | X | X |
| Example 2 | 50 | 5 | ◯ | ◯ | ◯ | ◯ | ◯ | ◯ |
| Example 3 | 50 | 5 | ◯ | ◯ | ◯ | ◯ | ◯ | ◯ |
| Comp. Example 1 | 0 | 0 | ◯ | X | X | X | X | X |
| Comp. Example 2 | 50 | 0 | ◯ | ◯ | ◯ | X | X | X |

◯: good without pattern peeling
X: occurrence of pattern peeling

As can be seen from the results in Table 1 above, the photosensitive resin composition for a black resist according to the present specification has chemical resistance to an etchant and a stripper, and thus has excellent adhesion to metal without peeling. In addition, the photosensitive resin composition is characterized in that it comprises one or both of the epoxy binder and the epoxy adhesion promoter.

Further, it can be seen that the compositions of Examples and 2, which contain the epoxy adhesion promoter, have increased chemical resistance compared to the composition of Comparative Example 1, which does not contain the epoxy binder and the epoxy adhesion promoter, or the composition of Comparative Example 2, which contains only the epoxy binder, but does not contain the epoxy adhesion promoter.

Particularly, the composition of Example 2, which contains both the epoxy binder and the epoxy adhesion promoter, has significantly increased chemical resistance compared to the composition of Comparative Example 1, which does not contain the epoxy binder or the epoxy adhesion binder, or the composition of Comparative Example 2, which contains only the epoxy binder, but does not contain the epoxy adhesion binder. In addition, the composition of Example 2 has increased chemical resistance compared to the composition of Example 1, which contains only the epoxy binder but does not contain the epoxy adhesion promoter.

This increase in chemical resistance makes it possible to increase the adhesion of the composition to a metal pattern and a substrate after an etching process and a stripping process during the formation of the metal pattern. In addition, it has been shown that the chemical resistance and adhesion of the composition of Comparative Example 1, which does not contain the epoxy binder or the epoxy adhesion promoter, were significantly lower than those of the compositions of Examples 1, 2 and 3.

The present specification is not limited to the above embodiments, and any person skilled in the art will appreciate that various applications and modifications are possible without departing from the scope of the present specification.

Although the present specification has been described in detail with reference to the specific features, it will be apparent to those skilled in the art that this description is only of a preferred embodiment thereof, and does not limit the scope of the present invention. Thus, the substantial scope of the present invention will be defined by the appended claims and equivalents thereof.

The invention claimed is:

1. A photosensitive resin composition comprising an alkali-soluble binder, a crosslinkable compound, a photopolymerization initiator, a solvent, a colorant and an epoxy adhesion promoter,
wherein the alkali-soluble binder includes one or more of a cardo-based binder and an acrylic binder, and
wherein the cardo-based binder includes a repeating unit represented by the following formula 1:

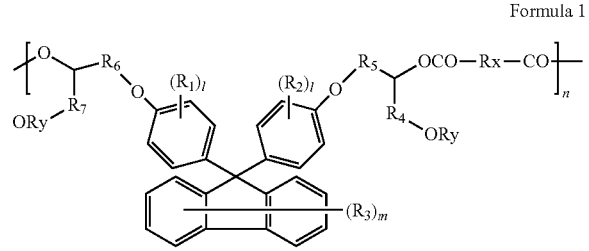

Formula 1 wherein Rx is a structure formed by reaction of a five-membered cyclic carboxylic anhydride or a diisocyanate,
Ry is selected from the group consisting of hydrogen, acryloyl and methacryloyl,
$R_1$ to $R_3$ are each independently selected from the group consisting of hydrogen, a halogen group, a substituted or unsubstituted $C_1$ to $C_5$ alkyl group, a substituted or unsubstituted $C_1$ to $C_5$ alkoxy group, and a substituted or unsubstituted $C_2$ to $C_5$ alkenyl group,
$R_4$ to $R_7$ are each independently selected from the group consisting of a substituted or unsubstituted $C_1$ to $C_5$ alkylene group, a substituted or unsubstituted $C_1$ to $C_5$ alkoxylene group, and a substituted or unsubstituted $C_2$ to $C_5$ alkenylene group,
l is an integer ranging from 1 to 4,
m is an integer ranging from 1 to 8, and
n is the number of the repeating unit represented by formula 1.

2. The photosensitive resin composition of claim 1, further comprising an epoxy binder.

3. The photosensitive resin composition of claim 2, wherein the epoxy binder is selected from the group consisting of a bisphenol type epoxy resin, a novolac type epoxy resin, a glycidyl ester type epoxy resin, a glycidyl amine type epoxy resin, a linear aliphatic epoxy resin, an alicyclic epoxy resin, and a biphenyl type epoxy resin.

4. The photosensitive resin composition of claim 2, wherein the epoxy binder has an epoxide equivalent weight of 5,000 g/eq or less.

5. The photosensitive resin composition of claim 2, wherein the content of the epoxy binder is 10 to 50 parts by weight based on 100 parts by weight of the binders.

6. The photosensitive resin composition of claim 2, wherein the content of the epoxy binder is 1 to 10 parts by weight based on 100 parts by weight of the photosensitive resin composition.

7. The photosensitive resin composition of claim 1, wherein the epoxy adhesion promoter is silsesquioxane.

8. The photosensitive resin composition of claim 1, wherein the content of the epoxy adhesion promoter is 0.01 to 1 part by weight based on 100 parts by weight of the photosensitive resin composition.

9. The photosensitive resin composition of claim 1, wherein the content of the alkali-soluble binder is 1 to 20 parts by weight based on 100 parts by weight of the photosensitive resin composition.

10. The photosensitive resin composition of claim 1, wherein the content of the crosslinkable compound is 1 to 10 parts by weight based on 100 parts by weight of the photosensitive resin composition.

11. The photosensitive resin composition of claim 1, wherein the content of the photopolymerization initiator is 0.1 to 10 parts by weight based on 100 parts by weight of the photosensitive resin composition.

12. The photosensitive resin composition of claim 1, wherein the content of the solvent is 40 to 90 parts by weight based on 100 parts by weight of the photosensitive resin composition.

13. The photosensitive resin composition of claim 1, wherein the content of the colorant is 2 to 12 parts by weight based on 100 parts by weight of the photosensitive resin composition.

14. The photosensitive resin composition of claim 1, wherein the cardo-based binder has an acid value of 10 to 200 KOH mg/g and a weight-average molecular weight of 1,000 to 30,000.

15. The photosensitive resin composition of claim 1, wherein the acrylic binder has an acid value of 10 to 200 KOH mg/g and a weight-average molecular weight of 1,000 to 50,000.

16. The photosensitive resin composition of claim 1, further comprising a photocrosslinking sensitizer or a curing accelerator.

17. The photosensitive resin composition of claim 1, wherein the content of the photocrosslinking sensitizer or the curing accelerator is 0.01 to 10 parts by weight based on 100 parts by weight of the photopolymerization initiator.

18. The photosensitive resin composition of claim 1, wherein the colorant includes carbon black or a black pigment which is a mixture of carbon black and an organic black pigment.

19. The photosensitive resin composition of claim 18, wherein the carbon black has a surface resistance of $10^{11}$ Ω·cm or higher.

20. A pattern formed using the photosensitive resin composition of claim 1.

21. The pattern of claim 20, wherein the pattern is a bezel pattern.

22. The pattern of claim 20, wherein the pattern has a layer thickness of 0.3 μm to 5 μm and an optical density (OD) of 3 or higher.

23. A method for fabricating a pattern, the method comprising the steps of: applying the photosensitive resin composition of claim 1 to a substrate; and exposing and developing the applied photosensitive resin composition.

24. A display panel comprising the pattern of claim 20.

25. The display panel of claim 24, wherein the display panel is a touch panel.

* * * * *